(12) United States Patent
Komazaki et al.

(10) Patent No.: US 10,671,120 B2
(45) Date of Patent: Jun. 2, 2020

(54) FIXING STRUCTURE OF COVER ON DISPLAY APPARATUS

(71) Applicant: CLARION CO., LTD., Saitama (JP)

(72) Inventors: Yukio Komazaki, Saitama (JP); Shuji Kasai, Saitama (JP); Masao Horie, Saitama (JP)

(73) Assignee: Clarion Co., Ltd., Saitama (JP)

( * ) Notice: Subject to any disclaimer, the term of this patent is extended or adjusted under 35 U.S.C. 154(b) by 0 days.

(21) Appl. No.: 16/308,189

(22) PCT Filed: May 26, 2017

(86) PCT No.: PCT/JP2017/019687
§ 371 (c)(1),
(2) Date: Dec. 7, 2018

(87) PCT Pub. No.: WO2017/217215
PCT Pub. Date: Dec. 21, 2017

(65) Prior Publication Data
US 2019/0302845 A1    Oct. 3, 2019

(30) Foreign Application Priority Data

Jun. 14, 2016  (JP) ................................. 2016-117912

(51) Int. Cl.
*H04N 5/64*  (2006.01)
*G06F 1/16*  (2006.01)
(Continued)

(52) U.S. Cl.
CPC ............ *G06F 1/1637* (2013.01); *B60K 35/00* (2013.01); *B60R 11/02* (2013.01); *G06F 1/1679* (2013.01); *G09F 9/00* (2013.01); *H05K 5/03* (2013.01)

(58) Field of Classification Search
CPC ....... B60K 35/00; B60R 11/02; G06F 1/1637; G06F 1/1679; G09F 9/00; H05K 5/03
See application file for complete search history.

(56) References Cited

U.S. PATENT DOCUMENTS 8,169,553 B2 *  5/2012  Yamanaka ............... H04N 5/64
                                                  348/836
8,366,213 B2 *  2/2013  Iwai ................. H04N 21/47214
                                                  312/7.2
(Continued)

FOREIGN PATENT DOCUMENTS

JP  2001-287569   * 10/2001
JP  2001287569 A  10/2001
(Continued)

OTHER PUBLICATIONS

International Preliminary Report on Patentability dated Dec. 18, 2018 for the corresponding PCT/JP2017/019687.
(Continued)

*Primary Examiner* — Jessica M Prince
(74) *Attorney, Agent, or Firm* — IP Business Solutions, LLC

(57) ABSTRACT

A display apparatus is configured to enable a cover to be firmly fixed with a compact structure. The display apparatus includes: a one-side cover 16 that covers a casing 15 from one of front and rear sides; an other-side cover 17 that covers the casing 15 from the other of the front and rear sides; and a cover member 18 that covers the side surface of the one-side cover 16 from the periphery, wherein the one-side cover 16 includes a fitting claw 22 protruding to the other-side cover 17 side, the other-side cover 17 includes a fitting section 32 into which the fitting claw 22 is to be inserted, the cover member 18 includes an engagement hole 50 that engages with the fitting claw 22 in the fitting section 32, and the casing 15 receives the fitting section 32 from the inside (Continued)

of the other-side cover 17 to maintain an engaged state of the fitting claw 22 with the engagement hole 50.

3 Claims, 9 Drawing Sheets

(51) Int. Cl.
*B60K 35/00* (2006.01)
*B60R 11/02* (2006.01)
*H05K 5/03* (2006.01)
*G09F 9/00* (2006.01)

(56) References Cited

U.S. PATENT DOCUMENTS

| | | | |
|---|---|---|---|
| 8,786,796 B2* | 7/2014 | Ito | G02F 1/133308 349/58 |
| 9,215,817 B1* | 12/2015 | Cohen | H04M 1/185 |
| 9,297,947 B2* | 3/2016 | Do | G02F 1/133308 |
| 9,913,015 B2* | 3/2018 | Engle | H04N 5/64 |
| 2012/0069585 A1* | 3/2012 | Hirota | H04N 5/64 362/382 |
| 2013/0033824 A1 | 2/2013 | Yonezawa et al. | |
| 2015/0062794 A1 | 3/2015 | Hirai et al. | |
| 2015/0296634 A1* | 10/2015 | Itoh | G02F 1/133308 361/679.01 |

FOREIGN PATENT DOCUMENTS

| | | |
|---|---|---|
| JP | 2003168886 A | 6/2003 |
| JP | 2013033110 A | 2/2013 |
| JP | 2014115313 A | 6/2014 |
| JP | 2014228672 A | 12/2014 |
| JP | 2015049619 A | 3/2015 |
| JP | 2015072372 A | 4/2015 |

OTHER PUBLICATIONS

Written Opinion of the International Searching Authority issued for the corresponding PCT/JP2017/019687.
International Search Report for corresponding International Patent Application No. PCT/JP2017/019687 dated Jul. 27, 2017.
Written Opinion for corresponding International Patent Application No. PCT/JP2017/019687 dated Jul. 27, 2017.

* cited by examiner

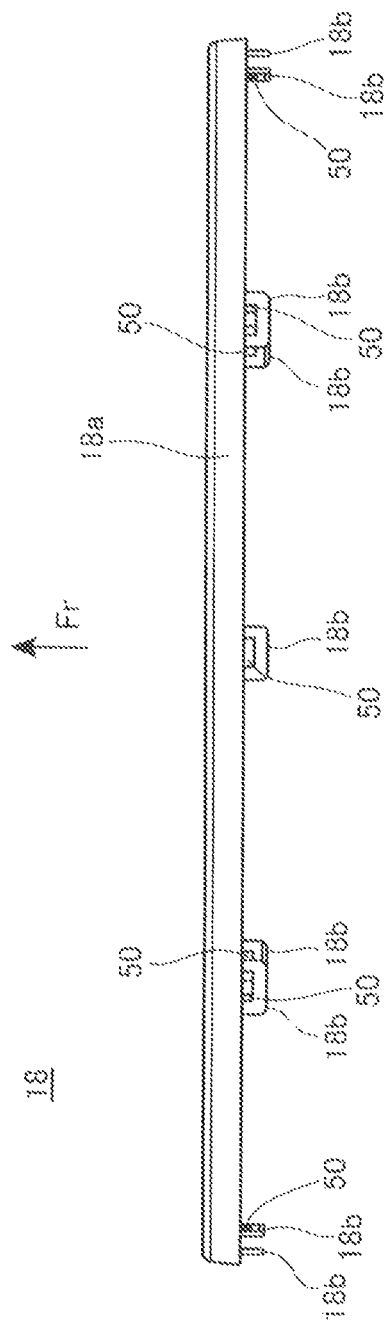

FIXING STRUCTURE OF COVER ON DISPLAY APPARATUS

TECHNICAL FIELD

The present invention relates to a display apparatus.

BACKGROUND ART

Conventionally, a technique of fixing a cover to a covering target by fitting a claw has been known (for example, refer to Patent Literature 1).

CITATION LIST

Patent Literature

[Patent Literature 1] Japanese Patent Laid-Open No. 2003-168886

SUMMARY OF INVENTION

Technical Problem

Now, for display apparatuses such as an audio apparatus and a navigation apparatus, since design factors are important, there are restrictions in the installation space of parts, and it is preferable that a cover be fixed with a compact fixing structure. Moreover, even with a compact fixing structure, it is preferable to firmly fix the cover.

The present invention has been made in view of the above circumstances, and an object of the invention is to make it possible to fix a cover firmly with a compact structure on a display apparatus.

Solution to Problem

The contents of Japanese Patent Application No. 2016-117912 filed on Jun. 14, 2016 are incorporated herein in their entirety.

In order to achieve the above-mentioned object, an aspect of the present invention is a display apparatus including a one-side cover that covers a casing from one of front and rear sides; an other-side cover that covers the casing from the other of the front and rear sides; and a cover member that covers a side surface of the one-side cover from the periphery, wherein the one-side cover includes a fitting claw protruding toward the other-side cover, the other-side cover includes a fitting section into which the fitting claw is inserted, the cover member includes an engagement hole that engages with the fitting claw in the fitting section, and the casing receives the fitting section from the inside of the other-side cover to maintain an engaged state of the fitting claw with the engagement hole.

Advantageous Effects of Invention

In a display apparatus according to the aspect of the present invention, a cover can be firmly fixed with a compact structure.

BRIEF DESCRIPTION OF DRAWINGS

FIG. 9 is a plan view of a cover member as viewed from the upper side.

DESCRIPTION OF EMBODIMENT

The following will describe an embodiment of the present invention with reference to the drawings.

Figure 1:
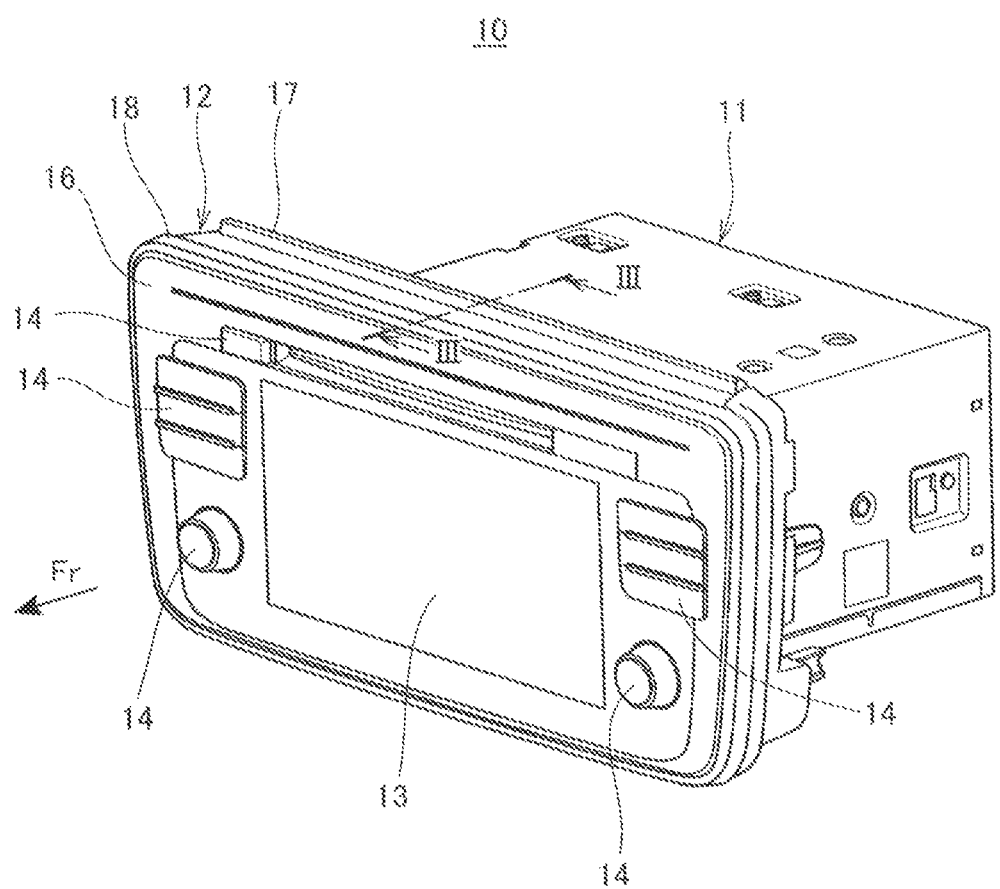
FIG. 1 is a perspective view showing an external configuration of a display apparatus according to an embodiment to which the present invention is applied.

FIG. 1 is a perspective view showing an external configuration of a display apparatus 10 according to an embodiment to which the present invention is applied.

The display apparatus 10 is an in-vehicle apparatus that is mounted in a vehicle, and is, for example, a car navigation apparatus. The display apparatus 10 has a voice reproducing function. That is, the display apparatus 10 is also an audio apparatus.

The display apparatus 10 is mounted, for example, on a dashboard in a passenger compartment of a car. The display apparatus 10 includes a box-like main body unit 11 arranged to be embedded in the dashboard, and a front face unit 12 attached to the front surface of the main body unit 11 and arranged to face a user. In the drawings, the front direction of the display apparatus 10 may be indicated by an arrow labelled with symbol Fr.

In the main body unit 11, an electronic board, a disk drive for reading information on a disk as a recording medium, etc. are housed.

In the front face unit 12, a display unit 13 for displaying various kinds of images (still images, moving images, videos), and a plurality of operation units 14 are mounted. The display unit 13 is, for example, a liquid crystal display. The operation units 14 are operation switches for detecting an input operation of the user, and various functions are assigned according to the process being executed by the display apparatus 10. The user can cause the display apparatus 10 to execute a desired function by operating an arbitrary operation unit 14.

Figure 2:
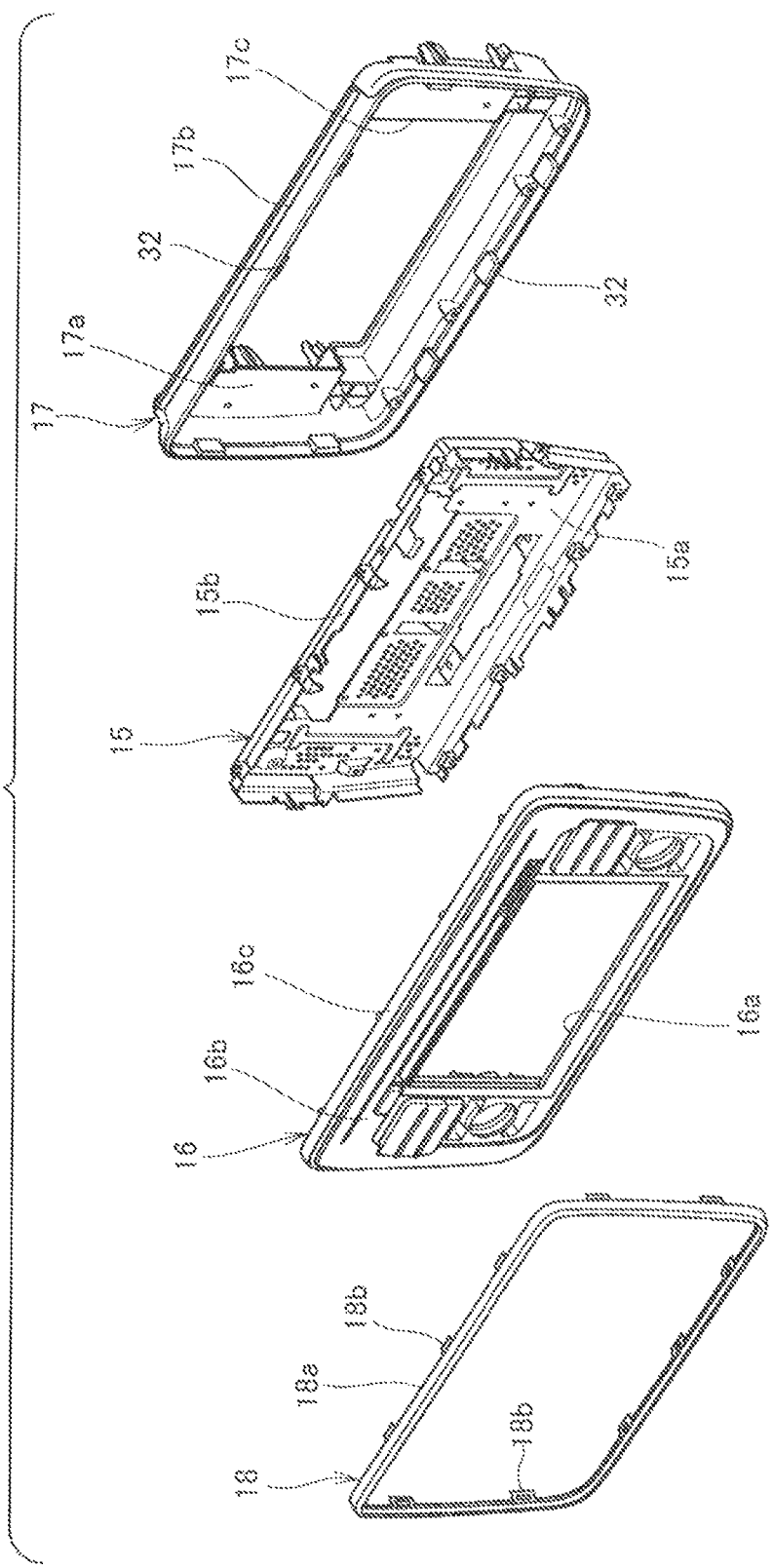
FIG. 2 is an exploded perspective view of a front face unit.

FIG. 2 is an exploded perspective view of the front face unit 12. Here, a part of the display unit 13 and the operation units 14 is not shown in FIG. 2.

Referring to FIGS. 1 and 2, the front face unit 12 includes a casing 15 as a frame of the front face unit 12, a one-side cover 16 that covers the casing 15 from one side (front side) in a front-rear direction of the display apparatus 10, an other-side cover 17 that covers the casing 15 from the other side (rear side) in the front-rear direction of the display apparatus 10, and a cover member 18 (cover) that covers the side surface of the one-side cover 16 from the periphery.

The display unit 13 (FIG. 1) is attached to the rear side of the one-side cover 16 and is exposed on the front side through an opening 16a of the one-side cover 16. An electronic board (not shown) connected to the display unit 13 and the operation units 14 is placed between the display unit 13 and the casing 15, and housed in the casing 15.

Figure 3:
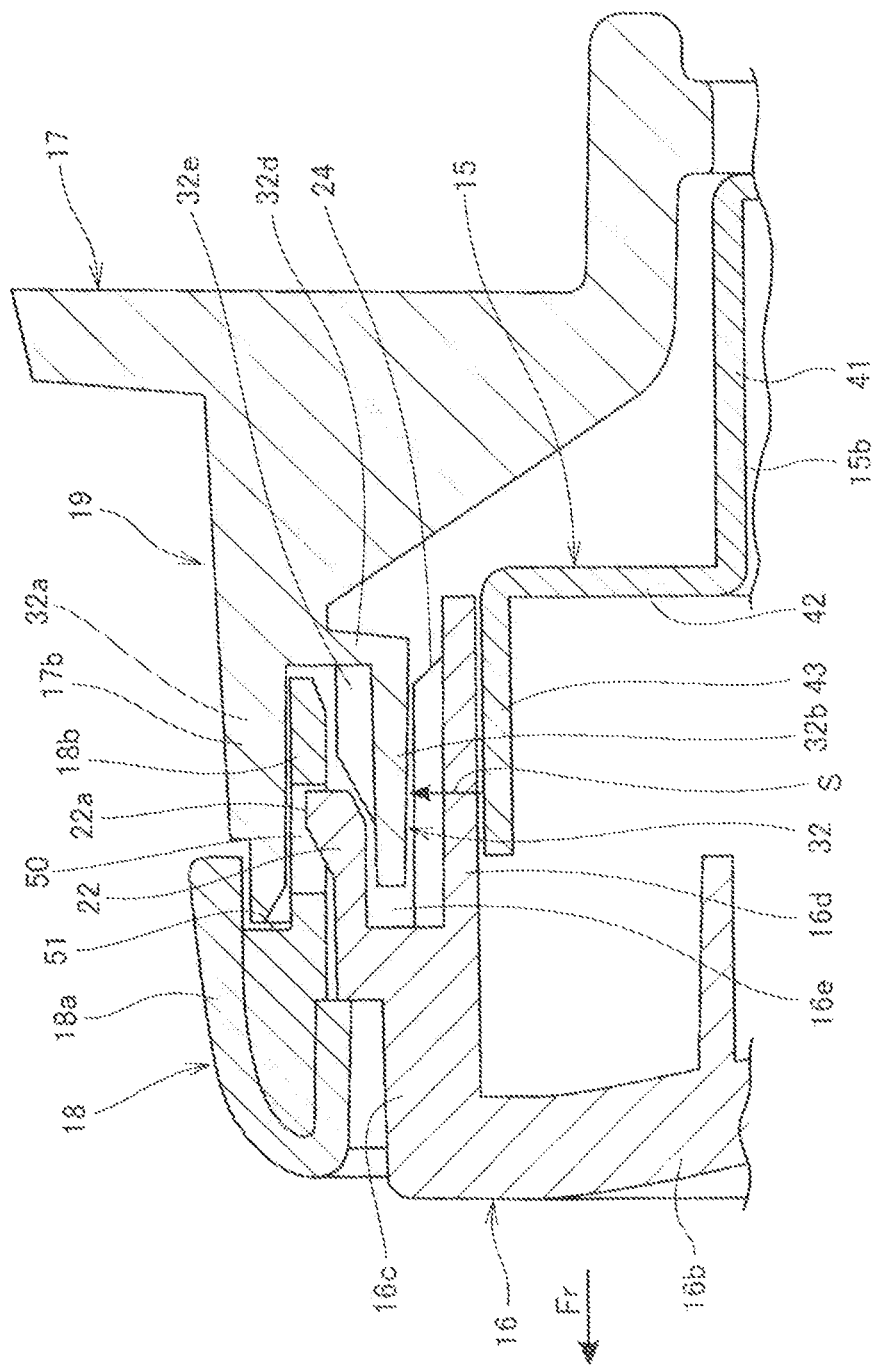
FIG. 3 is a III-III sectional view of FIG. 1.
Figure 4:
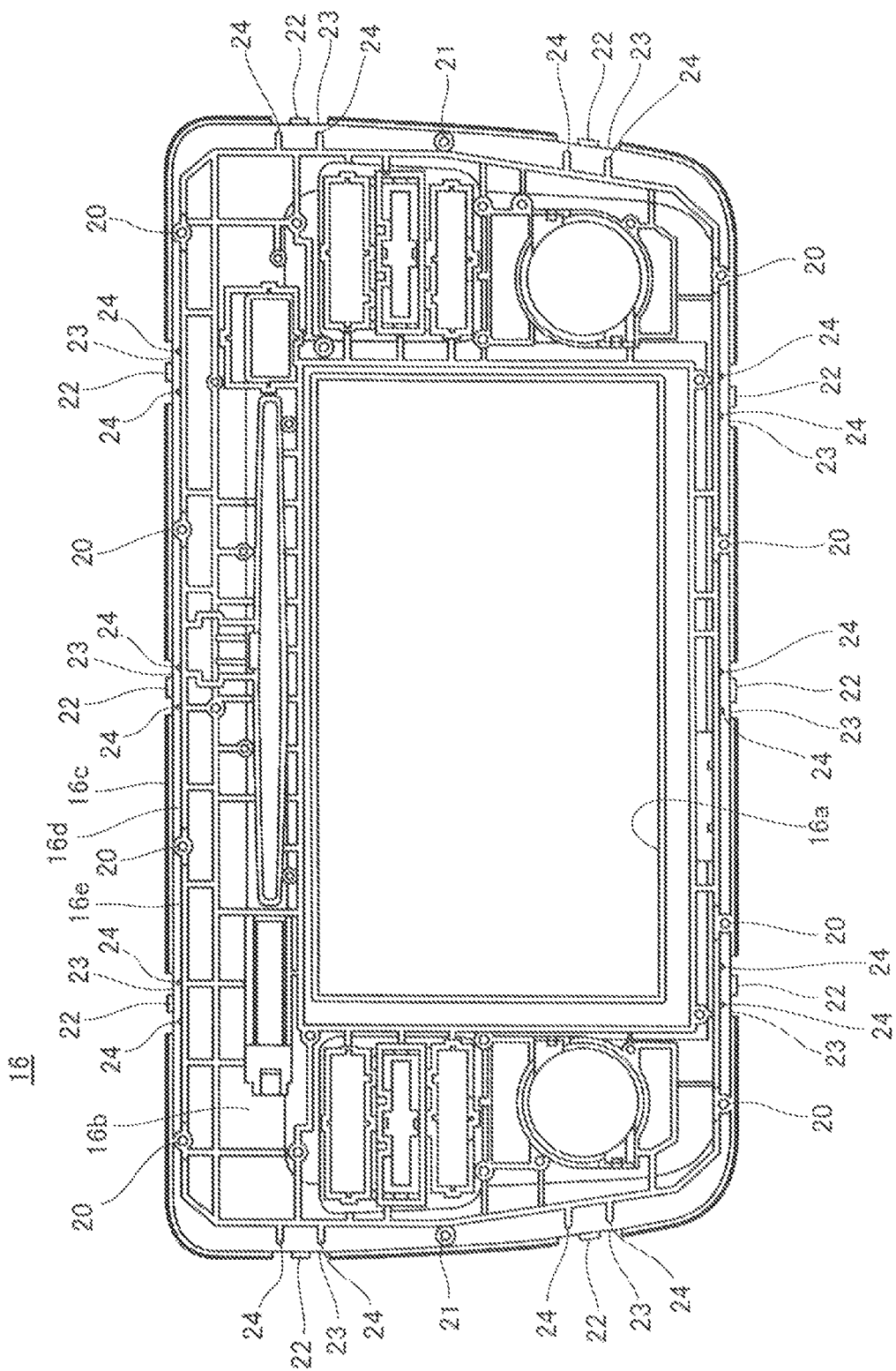
FIG. 4 is a front view of a one-side cover as viewed from the rear face side.
Figure 5:
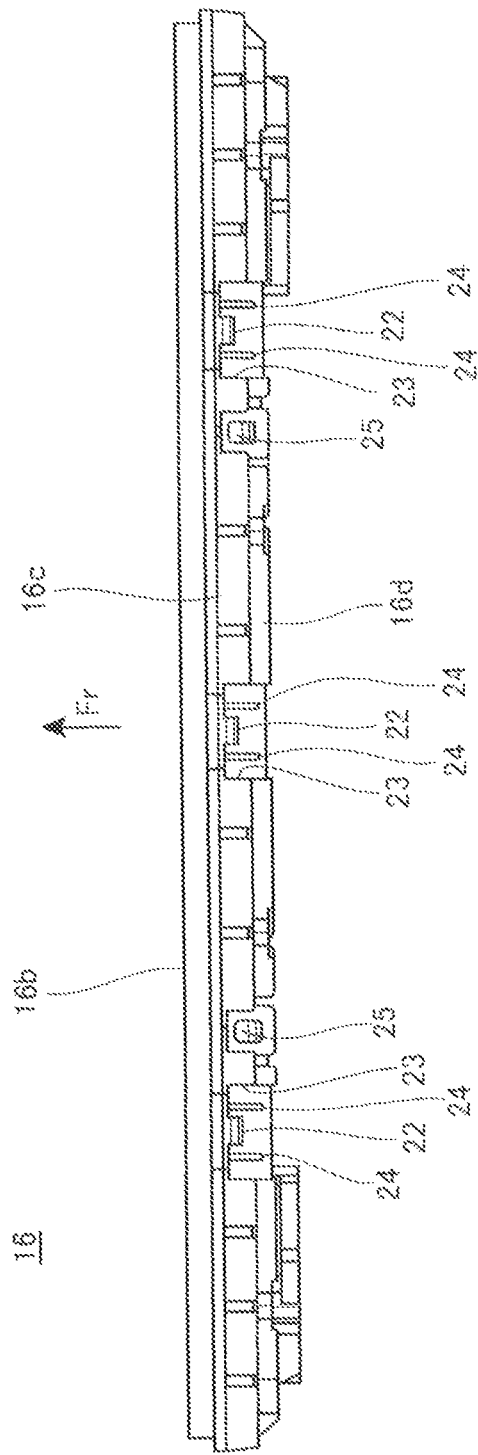
FIG. 5 is a plan view of the one-side cover as viewed from the upper side.

FIG. 3 is the III-III sectional view of FIG. 1. FIG. 4 is a front view of the one-side cover 16 as viewed from the rear side (the other-side cover 17 side). FIG. 5 is a plan view of the one-side cover 16 as viewed from the upper side.

Referring to FIGS. 2 to 5, the one-side cover 16 includes a substantially rectangular front wall part 16b covering the casing 15 from the front side, and a one-side cover side-wall part 16c (a side surface of the one-side cover) standing from the peripheral edge of the front wall part 16b to the other-side cover 17 side. The one-side cover 16 is a resin molded product.

The front wall part 16b is a plate formed in a rectangular shape longer in the left-right direction than in the top-bottom direction. The opening 16a is formed in the front wall part 16b.

The one-side cover side-wall part 16c is formed in a frame shape over the entire peripheral edge of the front wall part 16b.

The one-side cover 16 also includes a holding wall part 16d (holding part) positioned on more inner side of the one-side cover 16 than the one-side cover side-wall part 16c. The holding wall part 16d stands from the front wall part 16b toward the other-side cover 17 side and is formed in a frame shape over the entire peripheral edge of the front wall part 16b.

The holding wall part 16d is formed on the inner side with respect to the one-side cover side-wall part 16c with a space therebetween, whereby a frame shaped space 16e is formed between the one-side cover side-wall part 16c and the holding wall part 16d. The protruding height of the holding wall part 16d to the other-side cover 17 side is greater than the height of the one-side cover side-wall part 16c.

A cylindrical boss portion 20 is integrally formed on the holding wall part 16d. A cover fixing screw (not shown) for fixing the other-side cover 17 and the one-side cover 16 is fastened to the boss portion 20. A plurality of the boss portions 20 are formed with a space therebetween on the one-side cover side-wall part 16c.

Moreover, a plurality of cylindrical boss portions 21 are provided on the left and right sides of the one-side cover 16. A one-side casing fixing screw (not shown) for fixing the casing 15 to the one-side cover 16 is fastened to the boss portion 21.

On the one-side cover side-wall part 16c, a plurality of fitting claws 22 protruding to the other-side cover 17 side are formed. The plurality of fitting claws 22 are formed with a space therebetween on the one-side cover side-wall part 16c.

More specifically, the one-side cover side-wall part 16c includes a plurality of cut-out portions 23 formed by cutting out the one-side cover side-wall part 16c from the rear edge toward the front side. Each of the fitting claws 22 protrudes rearward from the front edge of each cut-out portion 23 to the other-side cover 17 side in the cut-out portion 23. Each of the fitting claws 22 has a protruding portion 22a (FIG. 3) protruding toward the outside of the one-side cover 16 at the distal end.

On the holding wall part 16d, a plurality of ribs 24 protruding to the fitting claw 22 side are provided in the vicinity of the fitting claws 22. More specifically, the ribs 24 are arranged to be positioned on the inside of the cut-out portion 23 when the one-side cover side-wall part 16c is viewed from the outside. The ribs 24 improve the strength and rigidity of the holding wall part 16d.

Further, as shown in FIG. 5, on the holding wall part 16d, an engagement hole 25 penetrating the holding wall part 16d is formed at a position separated from the fitting claw 22. A plurality of the engagement holes 25 are arranged with a space therebetween.

Figure 6:
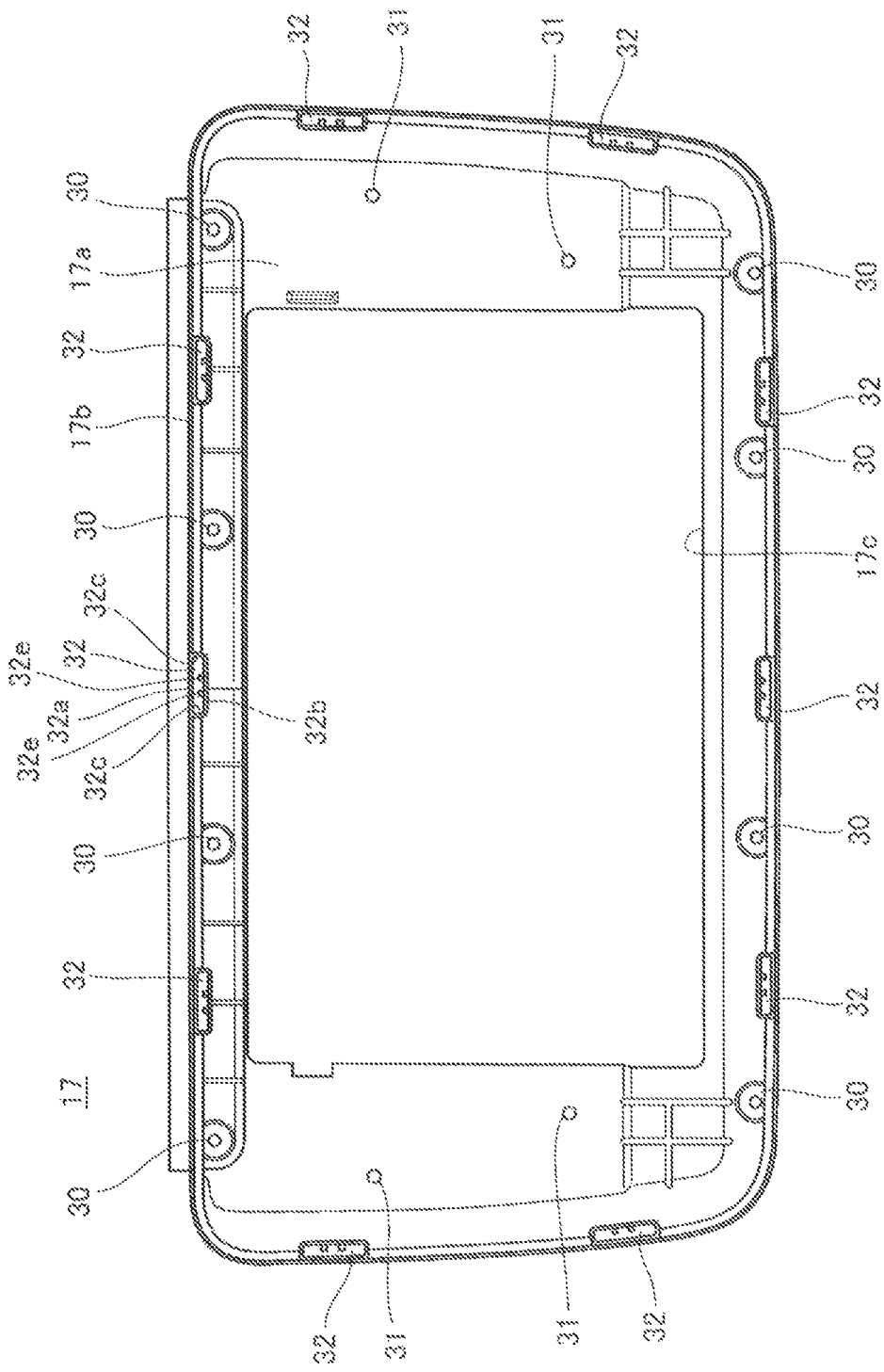
FIG. 6 is a front view of the other-side cover as viewed from the front side.

FIG. 6 is a front view of the other-side cover 17 as viewed from the front side (the one-side cover 16 side).

Referring to FIGS. 2, 3 and 6, the other-side cover 17 includes a substantially rectangular rear wall part 17a covering the casing 15 from the rear side, and an other-side cover side-wall part 17b standing from the peripheral edge of the rear wall part 17a to the one-side cover 16 side. The other-side cover 17 is a resin molded product.

The rear wall part 17a is a plate formed in a rectangular shape longer in the left-right direction than in the top-bottom direction. In the rear wall part 17a, a rectangular rear surface opening 17c communicating with the inside of the main body unit 11 (FIG. 1) is formed.

The other-side cover side-wall part 17b is formed in a frame shape over the entire peripheral edge of the rear wall part 17a.

On the inside of the other-side cover side-wall part 17b at the upper edge and the lower edge of the rear wall part 17a, a plurality of holes 30 through which the cover fixing screws are inserted from the rear side are formed along the other-side cover side-wall part 17b. Each hole 30 is provided at a position that overlaps the boss portion 20 (FIG. 4) in a state where the other-side cover 17 and the one-side cover 16 are assembled.

Further, on the rear wall part 17a, a plurality of holes 31 through which other-side casing fixing screws (not shown) for fixing the casing 15 to the other-side cover 17 are inserted from the rear side are formed on the left and right sides of the rear surface opening 17c.

On the front edge of the other-side cover side-wall part 17b, a plurality of fitting sections 32 into which the fitting claws 22 of the one-side cover 16 are inserted are formed. The fitting section 32 is a square hole section opened to the one-side cover 16 side on the front.

Each fitting section 32 is provided at a position that overlaps the fitting claw 22 in a state where the other-side cover 17 and the one-side cover 16 are assembled.

The fitting section 32 includes: an outside wall part 32a constituting a part of the outer peripheral surface of the other-side cover side-wall part 17b; an inside wall part 32b facing the outside wall part 32a at a more inner position of the other-side cover 17 than the outside wall part 32a; a pair of side wall parts 32c, 32c extending from both the ends of the outside wall part 32a and connecting the outside wall part 32a and the inside wall part 32b; and a bottom wall part 32d that closes the bottom of the fitting section 32.

A plurality of inner ribs 32e protruding from the inside wall part 32b to the outside wall part 32a side are formed in the fitting section 32. The inner ribs 32e improve the strength and rigidity of the fitting section 32. It should be noted that, in order to make the drawing easy to see, in FIG. 6, reference signs relating to the detailed portions of the fitting section 32 are added to only one fitting section 32 on the upper side.

Figure 7:
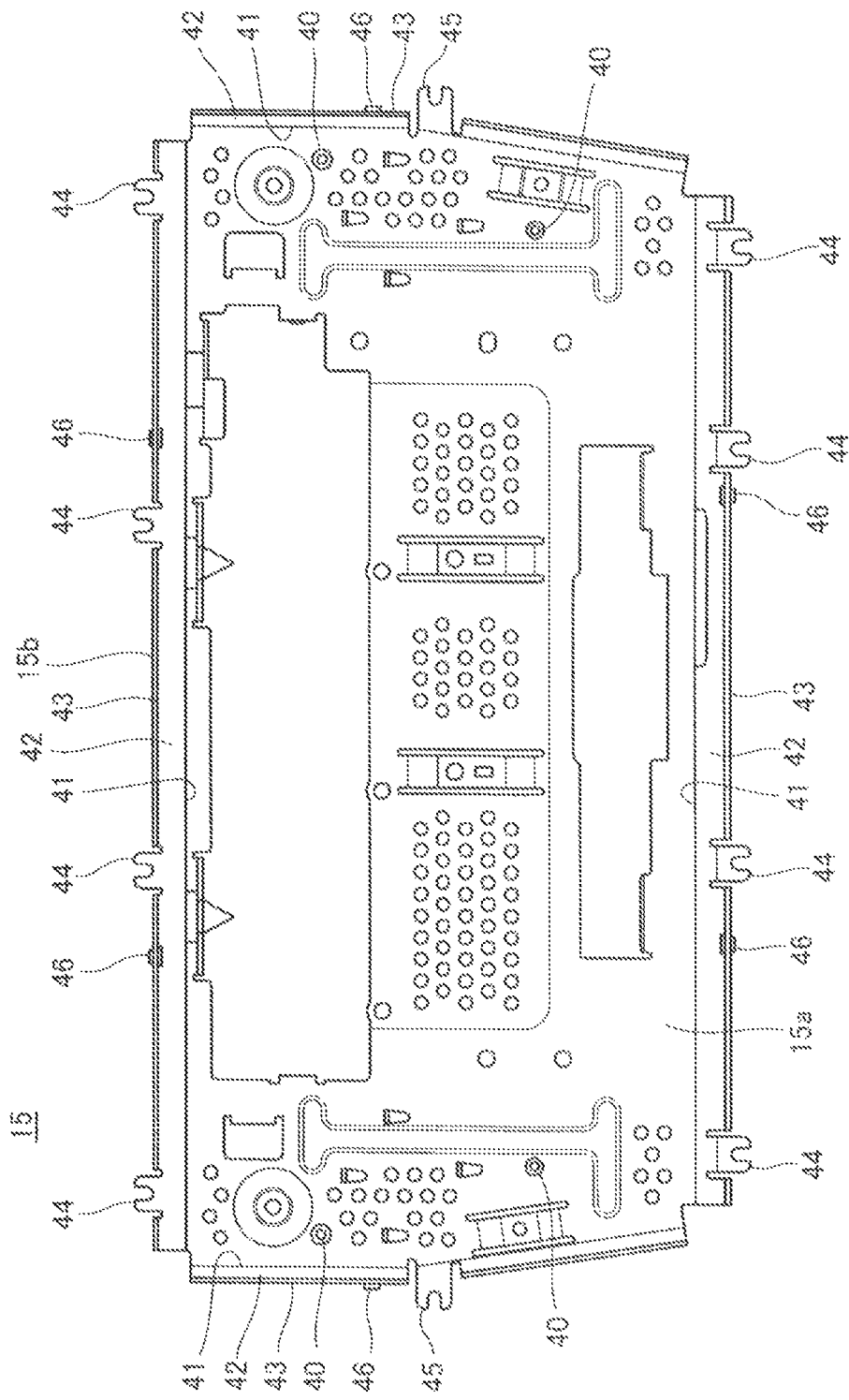
FIG. 7 is a front view of a casing as viewed from the front side.
Figure 8:
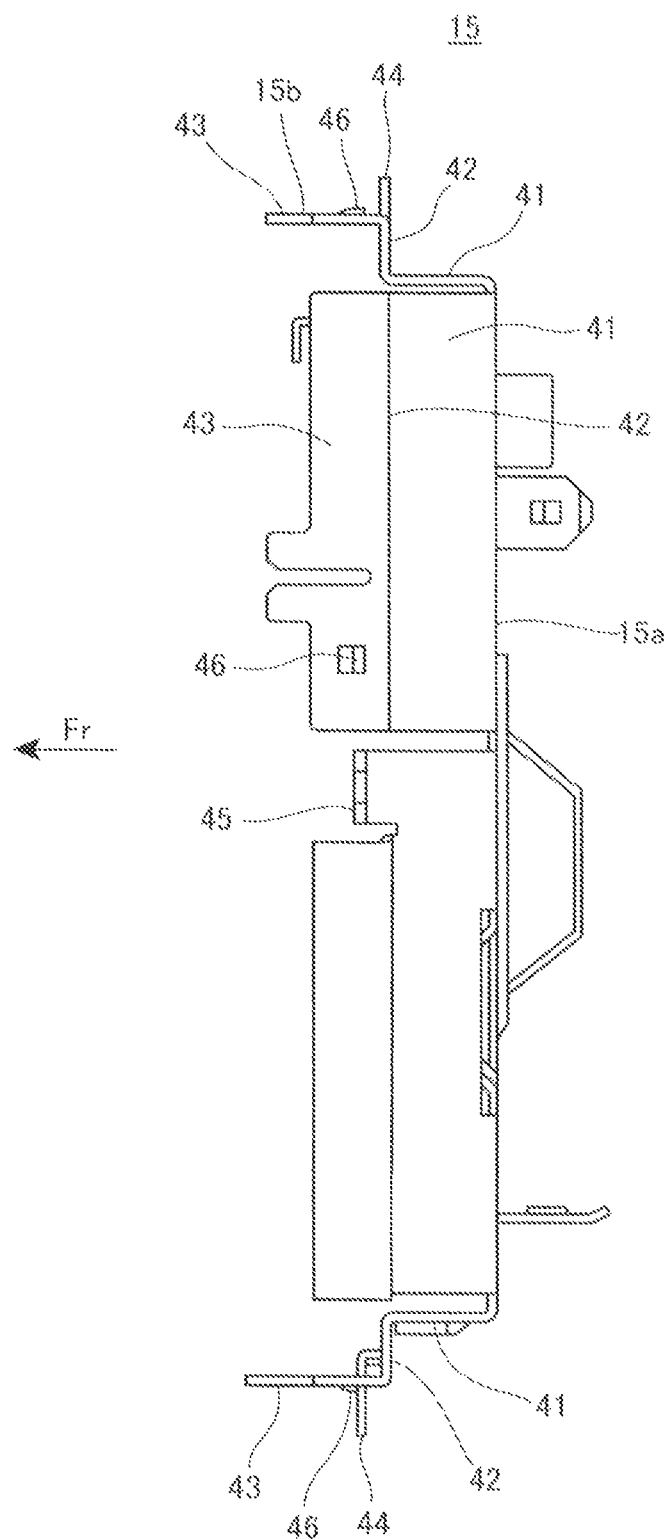
FIG. 8 is a side view of the casing as viewed from a side in the left-right direction.

FIG. 7 is a front view of the casing 15 as viewed from the front side (the one-side cover 16 side). FIG. 8 is a side view of the casing 15 as viewed from a side in the left-right direction.

Referring to FIGS. 3, 7 and 8, the casing 15 includes a substantially rectangular base plate part 15a covered by the front wall part 16b and the rear wall part 17a from the front side and the rear side, and a casing side-wall part 15b standing from the peripheral edge of the base plate part 15a to the one-side cover 16 side. The casing 15 is housed in a case body 19 (FIG. 3) formed by combining the one-side cover 16 and the other-side cover 17.

The casing 15 is a sheet metal member formed by performing sheet metal processing of a plate material of metal material such as steel material.

The base plate part 15a is a plate formed in a rectangular shape longer in the left-right direction than in the top-bottom direction. Formed on the left and right side portions of the base plate part 15a are a plurality of fixing holes 40 to which the other-side casing fixing screws inserted through the holes 31 (FIG. 6) of the other-side cover 17 are fastened.

The casing side-wall part 15b is a plate part formed in a frame shape over substantially the entire peripheral edge of the base plate part 15a.

More specifically, the casing side-wall part 15b includes: a proximal end portion 41 extending from the peripheral edge of the base plate part 15a to the one-side cover 16 side; a lateral extending portion 42 bent substantially at a right angle from the distal end of the proximal end portion 41 and extending toward the outside of the casing 15; and an extending portion 43 bent substantially at a right angle from the distal end of the lateral extending portion 42 and extending to the one-side cover 16 side.

The casing side-wall part 15b includes a plurality of locking portions 44 protruding from the distal end of the lateral extending portion 42 to the outside of the casing 15. Each locking portion 44 protrudes outward more than the extending portion 43. The plurality of the locking portions 44 are formed at positions corresponding to the holes 30 (FIG. 6) of the other-side cover 17. The cover fixing screw to be inserted through the hole 30 and fastened to the boss portion 20 (FIG. 4) of the one-side cover 16 is inserted through the locking portion 44. That is, the casing 15 is locked to the one-side cover 16 and the other-side cover 17 by the cover fixing screws inserted through the respective locking portions 44.

On the casing side-wall part 15b, a plurality of side locking portions 45 protruding to the outside of the casing 15 are provided at positions on the left and right side portions of the casing 15. Each side locking portion 45 is provided at a position corresponding to the boss portion 21 (FIG. 4) of the one-side cover 16. The casing 15 is fixed to the one-side cover 16 by the one-side casing fixing screws inserted into the side locking portions 45 from the rear side and fastened to the boss portions 21.

The extending portion 43 of the casing side-wall part 15b includes a plurality of projections 46 protruding to the outside of the casing 15. The plurality of projections 46 are formed at positions corresponding to the engagement holes 25 (FIG. 5) formed in the holding wall part 16d of the one-side cover 16. Each projection 46 is engaged with the engagement hole 25 from the inner side of the holding wall part 16d. That is, the one-side cover 16 is fixed to the casing 15 by engaging the projections 46 of the casing 15 with the engagement holes 25.

FIG. 9 is a plan view of the cover member 18 as viewed from the upper side.

Referring to FIGS. 2, 3 and 9, the cover member 18 is a cover that covers the one-side cover side-wall part 16c of the one-side cover 16 from the periphery and is formed in a frame shape along the outside surface of the one-side cover side-wall part 16c. The cover member 18 is a resin molded product, and is coated differently from the one-side cover 16.

In the present embodiment, the cover member 18 is configured as a body different from the one-side cover 16, and therefore it is possible to easily apply, for example, plating coating to the cover member 18. Hence, the cover member 18 constituting the contour portion of the front face unit 12 (FIG. 1) can be a plating-coated product, and the display apparatus 10 can have an improved appearance.

The cover member 18 includes a frame-shaped cover main body part 18a covering the one-side cover side-wall part 16c, and a plurality of protrusions 18b protruding from the cover main body part 18a to the other-side cover 17 side.

The plurality of protrusions 18b are formed at positions corresponding to the respective fitting sections 32 of the other-side cover 17. Each protrusion 18b is inserted from the front side into the fitting section 32 of the other-side cover 17 together with the fitting claw 22 of the one-side cover 16.

The protrusion 18b is formed in a plate shape having a plate thickness smaller than that of the cover main body part 18a. On the protrusion 18b, an engagement hole 50 penetrating the protrusion 18b is formed. The protruding portion 22a of the fitting claw 22 is engaged with the engagement hole 50.

On the rear surface of the cover main body part 18a, a recessed portion 51 (FIG. 3) recessed toward the front side is formed at a more outer position than the protrusion 18b.

As shown in FIG. 3, the one-side cover side-wall part 16c of the one-side cover 16 and the other-side cover side-wall part 17b of the other-side cover 17 are placed one in front of the other and joined together to form a case body 19, and the casing 15 is housed inside the case body 19. The cover member 18 is arranged to cover the joint between the one-side cover side-wall part 16c and the other-side cover side-wall part 17b, and hides the joint.

The cover member 18 is fixed to the case body 19 by engaging the engagement holes 50 of the protrusions 18b with the fitting claws 22 of the one-side cover 16.

More specifically, each protrusion 18b is inserted into the fitting section 32 of the other-side cover 17 together with the fitting claw 22, and the protruding portion 22a of the fitting claw 22 is engaged with the engagement hole 50 from the inside of the case body 19, within the fitting section 32. In this state, the protrusion 18b is in contact with the outside wall part 32a, and the fitting claw 22 is in contact with the inside wall part 32b. That is, the fitting claw 22 and the protrusion 18b are held between the outside wall part 32a and the inside wall part 32b of the fitting section 32, thereby maintaining an engaged state of the fitting claw 22 with the engagement hole 50.

In the present embodiment, the extending portion 43 of the casing side-wall part 15b of the casing 15 is placed in close proximity to the inside wall part 32b on more inner side of the case body 19 than the inside wall part 32b of the fitting section 32, and the extending portion 43 can receive deformation of the inside wall part 32b toward the inside of the case body 19.

More specifically, the holding wall part 16d of the one-side cover 16 is inserted between the inside wall part 32b and the extending portion 43 of the casing 15, and the extending portion 43 receives the inside wall part 32b through the holding wall part 16d. The holding wall part 16d is in contact with the inside wall part 32b through the rib 24.

When an external force acts to pull out the cover member 18 frontward, the fitting claw 22 is pressed by the protrusion 18b of the cover member 18 and a force that deforms the inside wall part 32b toward the inside of the case body 19 is generated, but this force can be received by a holding force S of the extending portion 43.

Thus, the force generated when pulling out the cover member 18 can be received by the extending portion 43 of the casing 15 made of a sheet metal having high strength and rigidity and the deformation of the fitting section 32 can be limited, and therefore it is possible to firmly fix the cover member 18 to the case body 19.

Further, the distal end of the other-side cover side-wall part 17b is engaged with the recessed portion 51 of the rear surface of the cover member 18. Hence, the cover member 18 can be located in an appropriate position by the distal end of the other-side cover side-wall part 17b.

As described above, according to the embodiment to which the present invention is applied, the display apparatus 10 includes: the one-side cover 16 that covers the casing 15 from one of the front and rear sides; the other-side cover 17 that covers the casing 15 from the other of the front and rear sides; and the cover member 18 that covers the one-side cover side-wall part 16c, which is the side surface of the one-side cover 16, from the periphery, wherein the one-side cover 16 includes the fitting claw 22 protruding to the other-side cover 17 side, the other-side cover 17 includes the fitting section 32 into which the fitting claw 22 is inserted, the cover member 18 includes the engagement hole 50 that engages with the fitting claw 22 in the fitting section 32, and the casing 15 receives the fitting section 32 from the inside of the other-side cover 17 to maintain the engaged state of the fitting claw 22 with the engagement hole 50. Thus, with the compact configuration where the fitting claw 22 of the one-side cover 16 is fitted into the engagement hole 50 of the cover member 18 in the fitting section 32 of the other-side cover 17, it is possible to fix the cover member 18. In addition, since the casing 15 receives the fitting section 32 to maintain the engaged state of the fitting claw 22 with the engagement hole 50, it is possible to prevent disengagement of the engagement hole 50 of the cover member 18 from the fitting claw 22, and the cover member 18 can be firmly fixed.

Moreover, the one-side cover 16 includes the holding wall part 16d to be inserted between the fitting section 32 and the casing 15, and the casing 15 receives the fitting section 32 through the holding wall part 16d. Thus, with the holding wall part 16d of the one-side cover 16 inserted between the fitting section 32 and the casing 15, it is possible to position the fitting claw 22 with respect to the fitting section 32, and the fitting claw 22 can be appropriately fitted into the fitting section 32. Further, since the casing 15 receives the fitting section through the holding wall part 16d, it is possible to downsize the casing 15 by an amount corresponding to the thickness of the holding wall part 16d.

Additionally, the cover member 18 includes the protrusion 18b to be inserted into the fitting section 32 and the engagement hole 50 is formed in the protrusion 18b, and therefore the fitting claw 22 can be fitted into the engagement hole 50 of the protrusion 18b of the cover member 18 within the fitting section 32, and the cover member 18 can be fixed with the compact structure.

Furthermore, the fitting section 32 of the other-side cover 17 includes the outside wall part 32a that comes into contact with the protrusion 18b, and the inside wall part 32b that is pressed by the casing 15 and comes into contact with the fitting claw 22, and therefore the fitting section with the protrusion 18b and the fitting claw 22 can be held between the outside wall part 32a and the inside wall part 32b. Consequently, the cover member 18 can be firmly fixed by the fitting claw 22.

It should be noted that the above-described embodiment shows one mode to which the present invention is applied, and the present invention is not limited to the above-described embodiment.

In the above-described embodiment, it is described that the casing 15 receives the fitting section 32 through the holding wall part 16d, but the present invention is not limited to this. The extending portion 43 of the casing 15 may be brought into direct contact with the inside wall part 32b without providing the holding wall part 16d.

Further, in the above-described embodiment, it is described that the one-side cover 16 is a cover that covers the casing 15 from the front side and the other-side cover 17 is a cover that covers the casing 15 from the rear side, but the present invention is not limited to this, and the one-side cover 16 may be a cover that covers the casing 15 from the rear side and the other-side cover 17 may be a cover that covers the casing 15 from the front side.

REFERENCE SIGNS LIST

10 Display apparatus
15 Casing
16 One-side cover
16d Holding wall part (holding part)
17 Other-side cover
18 Cover member
18b Protrusion
22 Fitting claw
32 Fitting section
32a Outside wall part
32b Inside wall part
50 Engagement hole

The invention claimed is:

1. A display apparatus comprising:
   a one-side cover that covers a casing from one of front and rear sides;
   an other-side cover that covers the casing from the other of the front and rear sides; and
   a cover member that covers a connecting part between the one-side cover and the other-side cover, wherein
   the one-side cover includes a fitting claw protruding toward the other-side cover,
   the other-side cover includes a fitting section into which the fitting claw is inserted,
   the fitting section includes an outside wall part constituting a part of an outer surface of the other-side cover, an inside wall part facing the outside wall part at a more inner side position of the other-side cover than the outside wall part, and a space between the outside wall part and the inside wall part,
   the cover member includes a protrusion to be inserted into the space of the fitting section, and in the protrusion, an engagement hole engages with the fitting claw in the fitting section, and
   the casing is placed in close proximity to the inside wall part, and suppresses a deformation of the inside wall part toward the inside by receiving the fitting section from the inside of the other-side cover to maintain an engaged state of the fitting claw with the engagement hole.

2. The display apparatus according to claim 1, wherein the one-side cover includes a holding part to be inserted between the fitting section and the casing, and the casing receives the fitting section through the holding part.

3. The display apparatus according to claim 1, wherein the fitting section of the other-side cover is configured in which the protrusion comes into contact with the inside of the outside wall part, and is configured in which the fitting claw comes into contact with the inside of the inside wall part by pressing the casing.

* * * * *